(12) United States Patent
Wert et al.

(10) Patent No.: US 6,731,139 B1
(45) Date of Patent: May 4, 2004

(54) SHORT CIRCUIT PROTECTION APPARATUS WITH SELF-CLOCKING SELF-CLEARING LATCH

(75) Inventors: Joseph D. Wert, Arlington, TX (US); Angela H. Wang, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/171,393

(22) Filed: Jun. 12, 2002

(51) Int. Cl.⁷ ................................................ H03K 9/06
(52) U.S. Cl. ............................. 327/49; 327/47; 327/48; 327/156; 327/163; 327/67
(58) Field of Search ..................... 327/47–163; 365/154

(56) References Cited

U.S. PATENT DOCUMENTS 6,466,058 B1 * 10/2002 Goldman

\* cited by examiner

Primary Examiner—Fetsum Abraham

(57) ABSTRACT

A latch for detecting a state transition of an input signal and generating a self-clearing reset signal on an output. The latch comprises: 1) a transfer gate for passing the input signal to a first node when the input transfer gate is enabled; 2) a transition detector for detecting a transition of the first node from a first to a second state, wherein the transition detector, in response to the transition, disables the transfer gate and enables the reset signal; and 3) a feedback loop circuit for detecting enabling of the reset signal. The feedback loop circuit, in response to the enabling, changes the first node from the second state back to the first state. The transition detector, in response to the changing of the first node back to the first state, disables the reset signal.

9 Claims, 2 Drawing Sheets

SHORT CIRCUIT PROTECTION APPARATUS WITH SELF-CLOCKING SELF-CLEARING LATCH

TECHNICAL FIELD OF THE INVENTION

The present invention is generally directed to integrated circuits and, in particular, to a self-clocking, self-clearing latch that can be used with a short circuit detection circuit if a clock signal is not available.

BACKGROUND OF THE INVENTION

In recent years, there have been great advancements in the speed, power, and complexity of integrated circuits, such as application specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (i.e., cell phone, a television receiver, and the like). SOC devices greatly reduce the size, cost, and power consumption of the overall system.

Many SOC devices contain peripheral device interfaces that communicate with external devices. For example, a SOC device may contain a Peripheral Component Interconnect (PCI) bus interface or a Universal Serial Bus (USB) interface communicating with one or more external devices. As part of a fault tolerant design, it is preferable to include short-circuit protection at an interface in order to protect the SOC device. If a short-circuit persists for more than a very brief period of time, the large current draw in the output line driver of the PCI bus interface or the USB interface may destroy the SOC device.

However, conventional short-circuit protection devices typically disable an interface or even an entire system if a short-circuit is detected. User intervention is then required to reset the device after the short-circuit has been removed.

Therefore, there is a need in the art for integrated circuits having improved short circuit protection. In particular, there is a need for a short-circuit protection apparatus for use in an electronic system that does not require user intervention to reset or re-enable the electronic system after a short-circuit has occurred.

SUMMARY OF THE INVENTION

The present invention provides a unique and novel circuit that can be used in an area of an integrated circuit, such as an SOC device, where a clock is not available. The present invention comprises an input stage that detects a rising signal edge (i.e., low to high transition), latches in the high signal, delays for a delay period determined by delay cells or an RC time constant, or both, and then clears the high signal from the latch. The present invention may also be modified to detect a high to low transition.

To address the above-discussed deficiencies of the prior art, it is a primary object of the present invention to provide a latch for detecting a state transition of an input signal and generating a self-clearing reset signal on an output. According to an advantageous embodiment of the present invention, the latch comprises: 1) a transfer gate capable of passing the input signal to a first node in the latch when the input transfer gate is enabled; 2) a transition detector capable of detecting a transition of the first node from a first state to a second state, wherein the transition detector, in response to the transition, disables the transfer gate and enables the reset signal; and 3) a feedback loop circuit capable of detecting enabling of the reset signal, wherein the feedback loop circuit, in response to the enabling, changes the first node from the second state back to the first state, and wherein the transition detector, in response to the changing of the first node back to the first state, disables the reset signal.

According to one embodiment of the present invention, the transition detector, in response to the changing of the first node back to the first state, enables the transfer gate.

According to another embodiment of the present invention, the transfer gate comprises an N-channel transistor in parallel with a P-channel transistor.

According to still another embodiment of the present invention, the transition detector generates a first control signal applied to a gate of the N-channel transistor of the transfer gate.

According to yet another embodiment of the present invention, the transition detector generates a second control signal applied to a gate of the P-channel transistor of the transfer gate.

According to a further embodiment of the present invention, the transition detector comprises a chain of inverters wherein an input of a first inverter of the chain of inverters is coupled to the first node and an output of a last inverter in the chain of inverters generates the reset signal.

According to a still further embodiment of the present invention, the feedback loop circuit comprises a drive transistor capable of changing the first node from the second state back to the first state.

According to a yet further embodiment of the present invention, the drive transistor discharges a capacitor coupled to the first node.

In one embodiment of the present invention, the feedback loop circuit further comprises a delay buffer having an input coupled to the reset signal and an output coupled to the drive transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
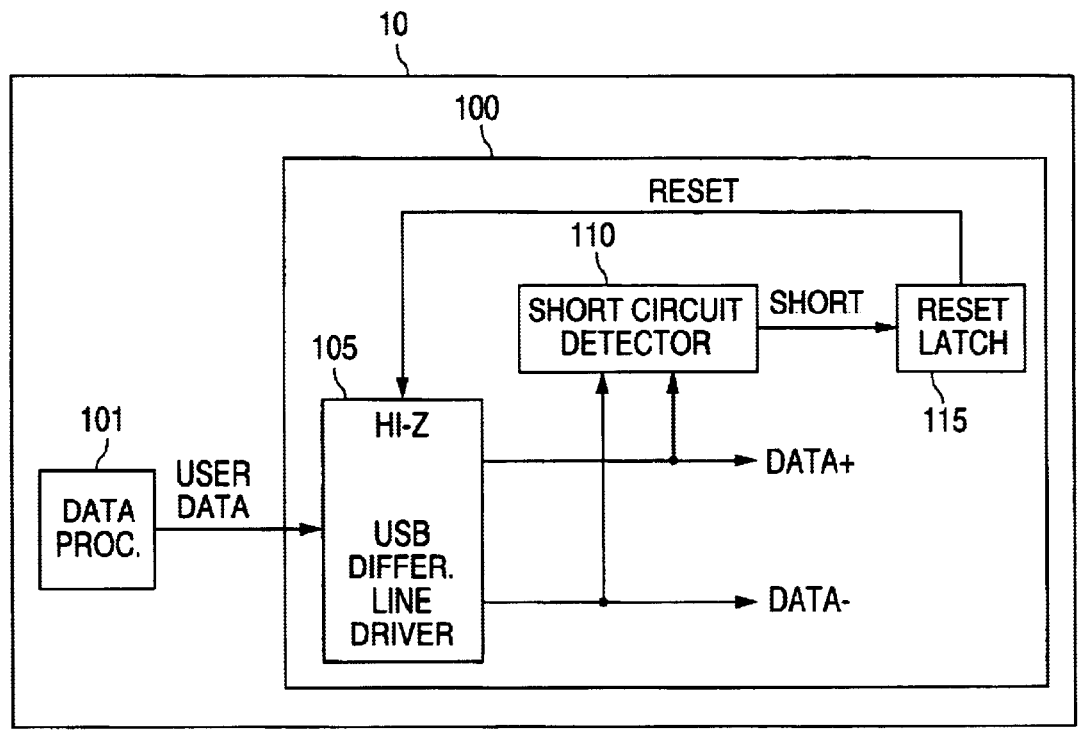
FIG. 1 illustrates a processing system which comprises an exemplary system-on-a-chip (SOC) device according to one embodiment of the present invention.
Figure 2:
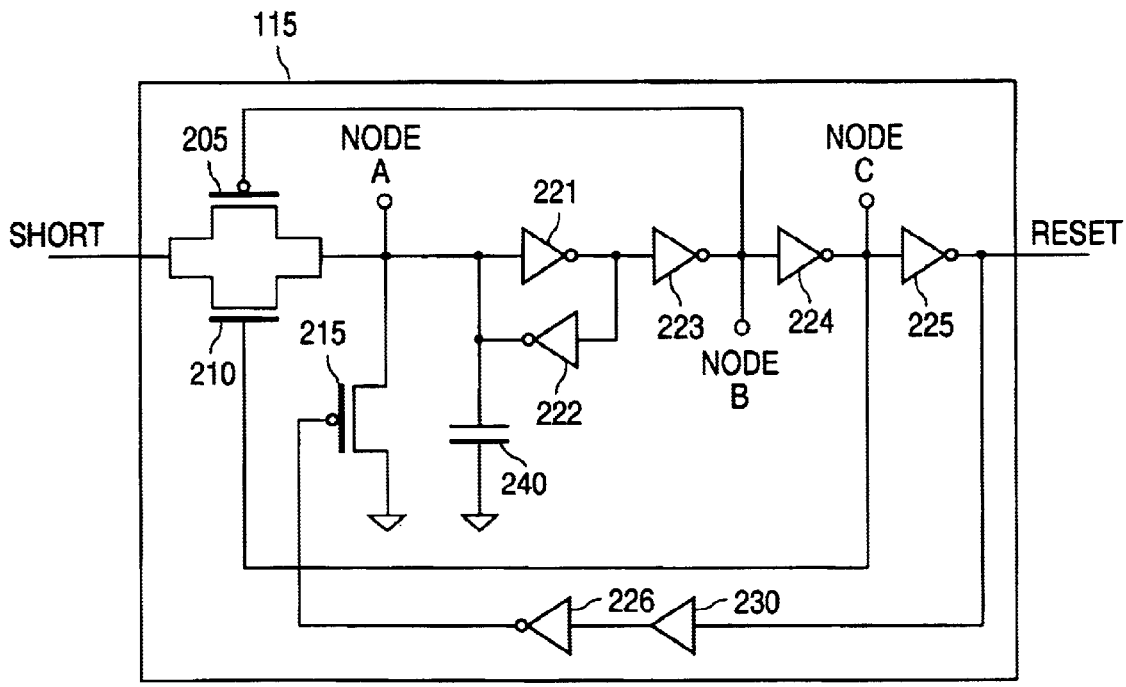
FIG. 2 illustrates an exemplary reset latch according to one embodiment of the present invention.
Figure 3:
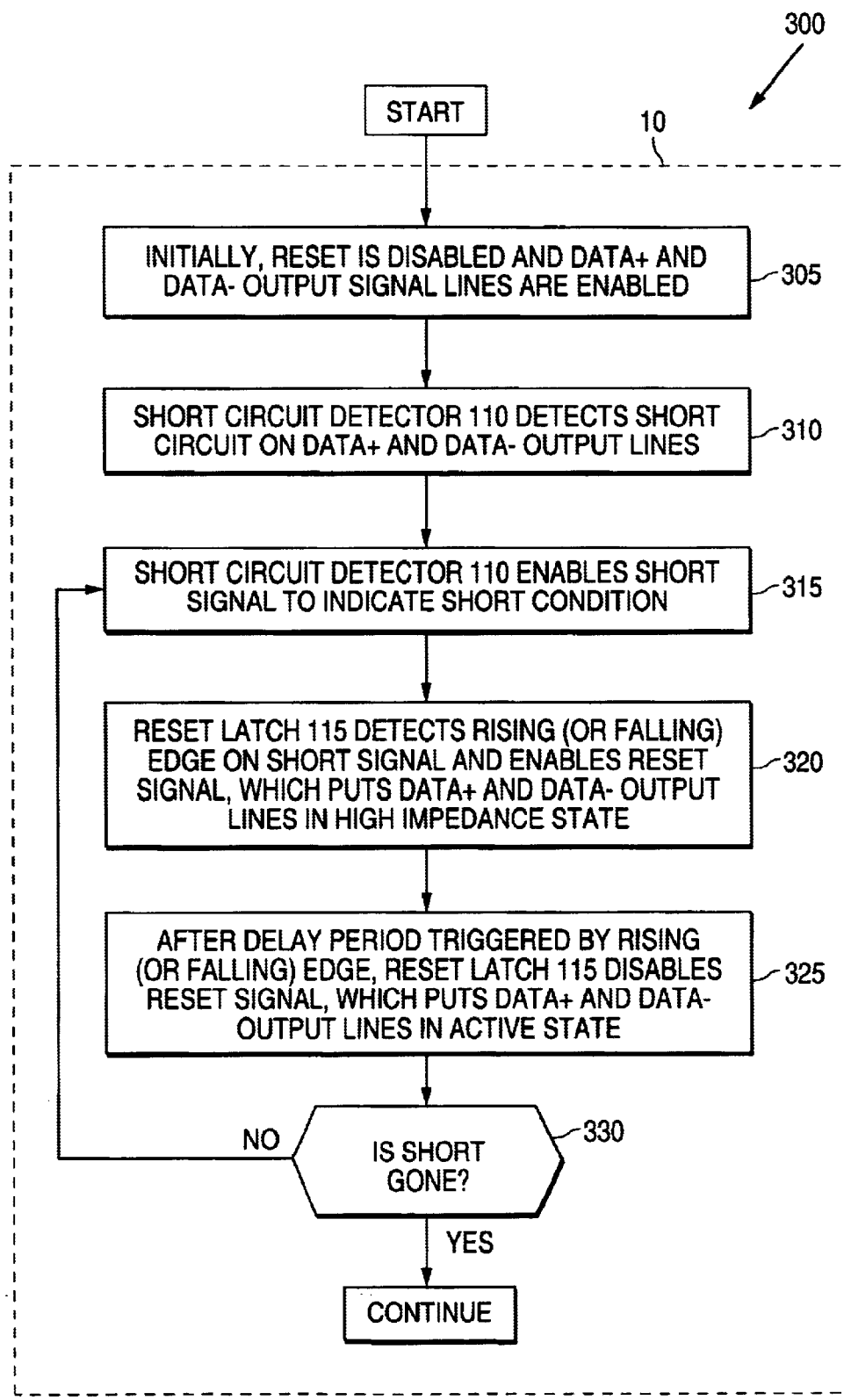
FIG. 3 is a flow diagram illustrating the operation of the processing system in FIG. 1 according to an exemplary embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

FIG. 1 illustrates selected portions of processing system 10, which may comprise a system-on-a-chip (SOC) device according to an exemplary embodiment of the present invention. Processing system 10 is shown in a general level of detail because it is intended to represent any one of a wide variety of electronic products, particularly network devices and consumer appliances. According to the exemplary embodiment, processing system 100 may be a single integrated circuit comprising output stage circuitry 100 and data processing circuitry 101. Output stage circuitry 100 comprises differential line driver 105, short circuit detector 110, and reset latch 115. Data processing circuitry 101 provides User Data as input to differential line driver 105.

FIG. 3 depicts flow diagram 300, which illustrates the operation of processing system 10 according to an exemplary embodiment of the present invention. Initially, the RESET generated by reset latch 115 is disabled and the DATA+ and DATA− output signal lines are enabled (or active) (process step 305). During routine operation, short circuit detector 110 detects a short-circuit condition on the DATA+ and DATA− output lines. The short may be on the DATA+ line, the DATA− line, or between the DATA+ and DATA− lines (process step 310). In response, short circuit detector 110 enables the SHORT signal to indicate a short-circuit condition is present (process step 315).

Reset latch 115 detects the rising (or falling) edge on the SHORT signal when the SHORT signal changes state and enables the RESET signal, which puts the DATA+ and DATA− output lines in a high impedance (HI-Z) state (process step 320). After a delay period triggered by the rising (or falling) edge of the SHORT signal, reset latch 115 disables the RESET signal, which puts the DATA+ and DATA− output lines in the active state (process step 325). Short circuit detector 110 then determines whether or not the short-circuit condition is gone (process step 330). If the short circuit is still present, the process repeats (loop back to process step 315). Otherwise, if the short-circuit condition is gone, differential line driver 105 resumes normal operations.

The duration of the time period during which the RESET signal disables differential line driver 105 is determined by the internal circuitry of reset latch 115. FIG. 2 illustrates exemplary reset latch 115 according to one embodiment of the present invention. Reset latch 115 comprises P-channel transistor 205, N-channel transistor 210, P-channel transistor 215, inverters 221–226, delay buffer 230, and capacitor 240. The SHORT signal is the input to reset latch 115 and the RESET signal is the output.

As will be explained below in greater detail, the chain of inverters 221, 223, 224 and 225 essentially comprise a state transition detection circuit that generates control signals for transistors 205 and 210 and that generates the RESET signal. Delay buffer 230, inverter 226, and transistor 215 form a feedback loop that self-clears the RESET signal.

Transistors 205 and 210 comprise an input transfer gate. Initially, transistors 205 and 210 are ON (a stable state, as seen below) and the SHORT signal is low (Logic 0), so that Node A is also Logic 0. Since Node A is Logic 0, the output of inverter 221 is Logic 1 and Node B, the output of inverter 223 is Logic 0. Inverter 222 is a relatively weak inverter that reinforces the state of inverter 221. The Logic 0 at Node B is applied to the gate of P-channel transistor 205, thereby maintaining transistor 205 in the ON state. Since Node B is Logic 0, Node C, the output of inverter 224, is Logic 1 and the RESET signal, the output of inverter 225 is Logic 0. The Logic 1 at Node C is applied to the gate of N-channel transistor 210, thereby maintaining transistor 210 in the ON state. The Logic 0 on the RESET signal is delayed by buffer 230 and inverted by inverter 226 to a Logic 1, which is applied to the gate of transistor 215, thereby maintaining transistor 205 in the OFF state.

So long as the SHORT signal is maintained a Logic 0, no change occurs and reset latch 115 is in a stable state. Eventually, however, a short-circuit condition may be detected and the SHORT signal is set to Logic 1. When SHORT goes high, capacitor 240 charges up and Node A goes to Logic 1. Inverter 222 is a weak device that can easily be over-driven by transistors 205 and 210. When Node A goes to Logic 1, the output of inverter 221 goes to Logic 0 and the output of inverter 222 now assists in maintaining Node A at Logic 1.

Since the output of inverter 221 is Logic 0, the output of inverter 223, Node B, is Logic 1. When Node B is Logic 1, P-channel transistor 205 is turned OFF. Since the output of inverter 223 is Logic 1, the output of inverter 224, Node C, is Logic 0. When Node C is Logic 0, N-channel transistor 210 is turned OFF. At this point, transistors 205 and 210 are both OFF, so that the input transfer gate formed by transistors 205 and 210 is OFF. Thus, the SHORT signal is effectively cut off from Node A.

However, this is not a stable state. Since Node C, the output of inverter 224 is Logic 0, the output of inverter 225, the RESET signal is Logic 1. When the RESET signal goes to Logic 1, the output lines of differential line driver 105 temporarily go into high impedance states, thereby providing protection from the short-circuit condition. However, when the RESET line goes to Logic 1, after a brief delay the output of delay buffer 230 also goes to Logic 1 and the output of inverter 226 then goes to Logic 0.

The Logic 0 on the output of inverter 226 is applied to the gate of P-channel transistor 215, thereby turning transistor 215 ON. Transistor 215 can also over-drive relatively weak inverter 222. Thus, when transistor 215 is ON, capacitor 240 discharges through transistor 215 and Node A is pulled down to Logic 0. The Logic 0 at Node A then ripples through inverters 221–226 and delay buffer 230. As a result, Node B goes to Logic 0, Node C goes to Logic 1, and transistors 205 and 210 are turned ON. Also, the RESET signal goes back to Logic 0, which turns OFF transistor 215 and removes the output lines of differential line driver 105 from the high impedance state.

Thus, the transition of the SHORT signal from Logic 0 to Logic 1 initially sets the RESET signal to Logic 1. However, this is a self-clearing condition because of the feedback from delay buffer 230, inverter 226 and P-channel transistor 215. Thus, the RESET signal cannot remain at Logic 1.

Since transistors 205 and 210 are now turned back ON, the SHORT signal may again flow through the input transfer gate formed by transistors 205 and 210. If the short-circuit condition has been removed, the SHORT signal goes back to Logic 0 and Node A remains at Logic 0. As noted above, this is a stable state. However, if the short-circuit condition has not been removed, the SHORT signal remains at Logic 1 and Node A again changes state from Logic 0 to Logic 1. This transition then repeats the cycle described above in which the RESET signal is driven to a Logic 1 and then is self-cleared back to a Logic 0. The cycle continues to repeat until the short-circuit condition is removed.

The time duration when the RESET signal is at Logic 1 is determined by the gate delays of inverters 221–226, delay buffer 230, and the RC time constant of capacitor 240 and transistor 215. This duration may be extended in a number of ways, including by increasing the delay of delay buffer 230 or adding a chain of inverters to replace inverter 226 in the feedback loop.

Those skilled in the art will readily understand that the present invention may easily be modified to trigger on a change in the SHORT signal from a Logic 1 to a Logic 0 (i.e., a negative-going edge), rather than on a transition from a Logic 0 to a Logic 1, as described above. For example, the circuit in FIG. 2 may be modified to include an inverter before the input of the input transfer gate formed by transistors 205 and 210.

Although the present invention has been described in detail, those skilled in the art should understand that they can make various changes, substitutions and alterations herein without departing from the spirit and scope of the invention in its broadest form.

What is claimed is:

1. A latch for detecting a state transition of an input signal and generating a self-clearing reset signal on an output, said latch comprising:

a transfer gate capable of passing said input signal to a first node in said latch when said input transfer gate is enabled;

a transition detector capable of detecting a transition of said first node from a first state to a second state, wherein said transition detector, in response to said transition, disables said transfer gate and enables said reset signal; and a feedback loop circuit capable of detecting enabling of said reset signal, wherein said feedback loop circuit, in response to said enabling, changes said first node from said second state back to said first state, and wherein said transition detector, in response to said changing of said first node back to said first state, disables said reset signal.

2. The latch as set forth in claim 1 wherein said transition detector, in response to said changing of said first node back to said first state, enables said transfer gate.

3. The latch as set forth in claim 2 wherein said transfer gate comprises an N-channel transistor in parallel with a P-channel transistor.

4. The latch as set forth in claim 3 wherein said transition detector generates a first control signal applied to a gate of said N-channel transistor of said transfer gate.

5. The latch as set forth in claim 4 wherein said transition detector generates a second control signal applied to a gate of said P-channel transistor of said transfer gate.

6. The latch as set forth in claim 5 wherein said transition detector comprise a chain of inverters wherein an input of a first inverter of said chain of inverters is coupled to said first node and an output of a last inverter in said chain of said inverters generates said reset signal.

7. The latch as set forth in claim 1 wherein said feedback loop circuit comprises a drive transistor capable of changing said first node from said second state back to said first state.

8. The latch as set forth in claim 7 wherein said drive transistor discharges a capacitor coupled to said first node.

9. The latch as set forth in claim 8 wherein said feedback loop circuit further comprises a delay buffer having an input coupled to said reset signal and an output coupled to said drive transistor.

* * * * *